(12) United States Patent
Kawano et al.

(10) Patent No.: US 8,143,716 B2
(45) Date of Patent: Mar. 27, 2012

(54) SEMICONDUCTOR DEVICE WITH PLATE-SHAPED COMPONENT

(75) Inventors: Masaya Kawano, Kanagawa (JP); Nobuaki Takahashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 751 days.

(21) Appl. No.: 11/088,836

(22) Filed: Mar. 25, 2005

(65) Prior Publication Data
US 2005/0212114 A1 Sep. 29, 2005

(30) Foreign Application Priority Data
Mar. 29, 2004 (JP) ................................. 2004-095965

(51) Int. Cl.
*H01L 23/04* (2006.01)
*H01L 23/02* (2006.01)
(52) U.S. Cl. ......... 257/698; 257/686; 257/690; 257/778
(58) Field of Classification Search .......... 257/684–686, 257/688–690, 698, 738, 777, 778, 784, E23.067, 257/E23.169, E23.174
See application file for complete search history.

(56) References Cited

U.S. PATENT DOCUMENTS

| | | | | |
|---|---|---|---|---|
| 6,052,287 A | * | 4/2000 | Palmer et al. | 361/767 |
| 6,424,034 B1 | * | 7/2002 | Ahn et al. | 257/723 |
| 6,525,414 B2 | * | 2/2003 | Shiraishi et al. | 257/686 |
| 6,680,212 B2 | * | 1/2004 | Degani et al. | 438/14 |
| 2002/0195700 A1 | * | 12/2002 | Li | 257/700 |

FOREIGN PATENT DOCUMENTS

| | | |
|---|---|---|
| JP | 05-048001 | 2/1993 |
| JP | 2000-22074 | 1/2000 |
| JP | 2000-252408 | 9/2000 |
| JP | 2002-237468 | 8/2002 |

OTHER PUBLICATIONS

Japanese Office Action dated Jul. 29, 2008, with partial English translation.

* cited by examiner

*Primary Examiner* — Hung Vu
(74) *Attorney, Agent, or Firm* — McGinn Intellectual Property Law Group, PLLC

(57) ABSTRACT

The invention provides a semiconductor device including a plurality of stacked semiconductor chips, which offers a higher degree of freedom in selecting a chip size of the semiconductor chip and arranging the routing, and increase of the reliability and speed in signal transmission between the semiconductor chips. The semiconductor device includes a lower semiconductor chip, an upper semiconductor chip and a silicon spacer formed between the lower semiconductor chip and the upper semiconductor chip and including a projecting portion projecting farther outward than an outer periphery of the upper semiconductor chip, and the silicon spacer includes through electrodes and reroutings.

22 Claims, 12 Drawing Sheets

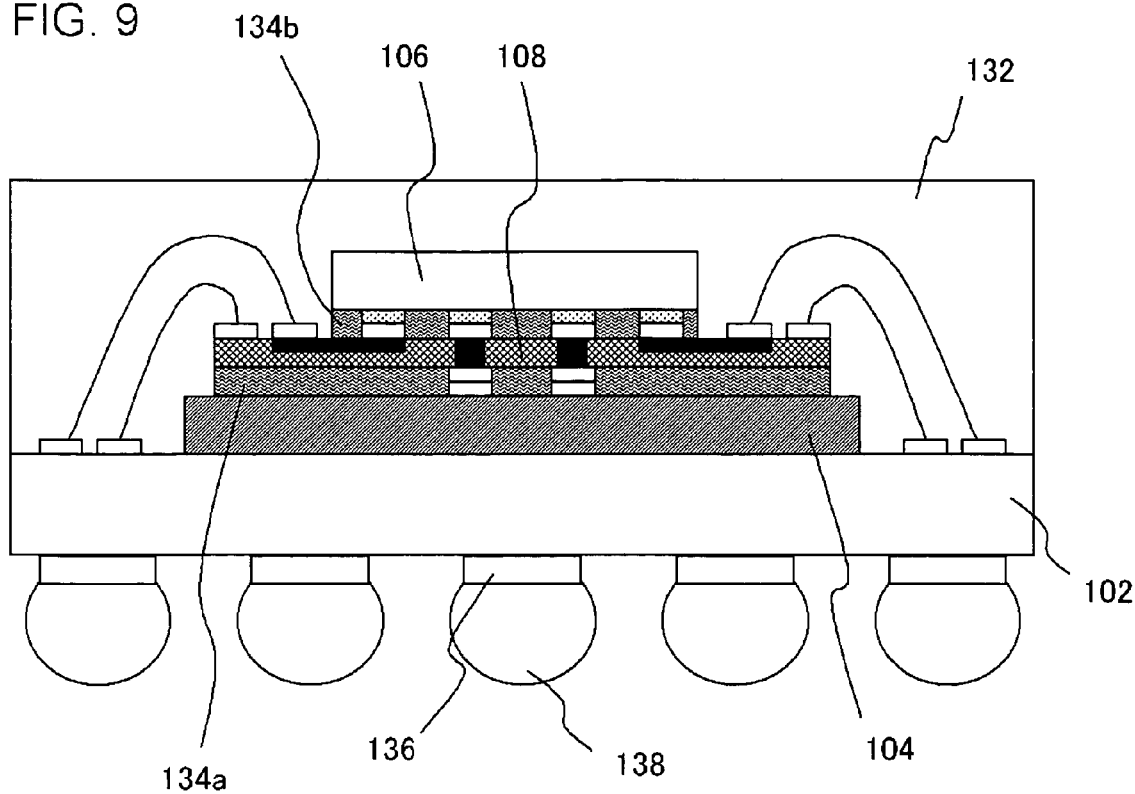

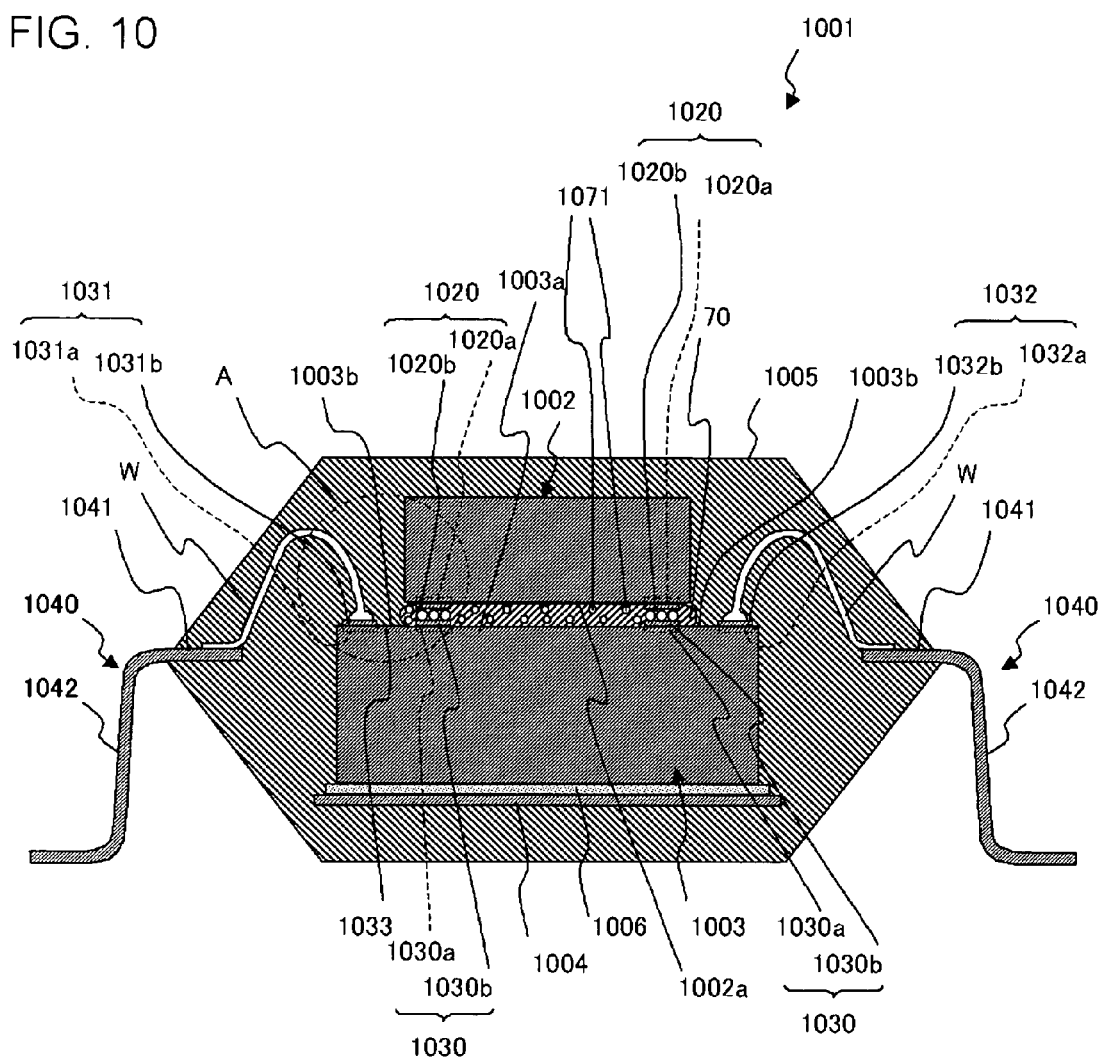

SEMICONDUCTOR DEVICE WITH PLATE-SHAPED COMPONENT

This application is based on Japanese patent application No. 2004-095965, the content of which is incorporated hereinto by reference.

BACKGROUND OF THE INVENTION

1. Field of the Invention

The present invention relates to a semiconductor device.

2. Related Art

In recent years, with the view of achieving an even higher degree of integration of a semiconductor chip, development of three-dimensional package in which semiconductor chips such as LSI are stacked in a longitudinal direction has lately been vigorously carried out. Such attempts include a technique disclosed in JP-A Laid Open No. 2000-22074. A semiconductor device described therein is shown in FIGS. 10 and 11. FIG. 10 is a schematic cross-sectional view showing a multichip stack structure based on a conventional flip chip connection. FIG. 11 is an enlarged view of the area A enclosed in a dashed circle in FIG. 10.

As shown in FIG. 10, the semiconductor device 1001 has a configuration that a second semiconductor chip 1003 is mounted on a die pad 1004 made of a metal such as nickel, for example, via a resin-based adhesive 1006, and a first semiconductor chip 1002 which serves as a controlling semiconductor chip, is stacked on the second semiconductor chip 1003. Further, the first semiconductor chip 1002, the second semiconductor chip 1003, and the die pad 1004 are sealed by a resin package 1005 constituted of a thermosetting resin such as an epoxy resin.

The first semiconductor chip 1002 includes a predetermined circuit (not shown in the drawings) and an interconnect pattern (not shown in the drawings) for driving the circuit integrally formed on a main face 1002a thereof, and also a plurality of first terminal pads 1020a electrically conductive with the circuit via the interconnect pattern. Also, the circuit and the interconnect pattern are covered with an insulating layer (not shown in the drawings) with the first terminal pads 1020a remaining exposed, so that the first terminal pads 1020a only can be electrically conductive with outer portion of the first semiconductor chip 1002.

The second semiconductor chip 1003 has a larger plan view area than the first semiconductor chip 1002, and is provided with a predetermined circuit (not shown in the drawings) integrally formed on a main face 1003 thereof, like the first semiconductor chip 1002. Also, the second semiconductor chip 1003 is provided thereon with a plurality of second terminal pads 1030a, 1031a, 1032a, and an insulating layer (not shown in the drawings) except on the second terminal pads 1030a, 1031a, 1032a.

Referring to FIG. 11, the second terminal pad 1031a is disposed in a side region 1003b of the first semiconductor chip 1002 which is defined when the first semiconductor chip 1002 is stacked on the second semiconductor chip 1003, for electrical connection with the second terminal pad 1030a via an routing portion 1033. The routing portion 1033 is formed at the same time as formation of the terminal pads 1030a, 1031a, 1032a and the interconnect pattern. Also, the terminal pad 1031a is provided thereon with a bump 1031b, for example constituted of Au, so that the terminal pad 1031a for signals and the bump 1031b constitute a terminal portion 1031 for signals.

Here, the routing portion 1033 is formed by metal plating or vapor deposition of a metal so as to connect the respective upper faces of the second terminal pad 1030a and the terminal pad 1031a for signals. Alternatively, a metal foil formed in a predetermined shape may be stuck to constitute the routing portion 1033.

Also, the terminal portion 1031 for signals and the second terminal portion 1032 of the second semiconductor chip 1003 are respectively connected to an external connection terminal 1040 via a wire W. The external connection terminal 1040 is utilized when packaging the semiconductor device 1001 on a predetermined circuit board or the like, and includes an internal lead wire 1041 constituting an internal terminal portion sealed in inside the resin package 1005 and an external lead wire 1042 which is an external portion of the internal lead wire 1041 and projecting outside the resin package 1005.

Now, when constituting the stack structure by a technique that an anisotropic conductive resin 1007 is employed, and the resin component 1070 thereof is first melted. Then the first semiconductor chip 1002 is pressed toward the second semiconductor chip 1003, with the first terminal portion 1020 of the first semiconductor chip 1002 disposed so as to confront the second terminal portion 1030 of the second semiconductor chip 1003, thus to form the stack structure.

At this stage, since the resin component 1070 is melted and conductive balls 1071 are dispersed in the resin component 1070, the resin component 1070 located between the first terminal portion 1020 and the second terminal portion 1030 is squeezed aside, so that the conductive balls 1071 are interposed between the first terminal portion 1020 and the second terminal portion 1030. Then upon thermally setting the resin component 1070, the main face 1002a of the first semiconductor chip and the main face 1003a of the second semiconductor chip are mechanically connected. Also, since the conductive balls 1071 are interposed between the first terminal portion 1020 and the second terminal portion 1030, electrical connection is achieved between the first terminal portion 1020 and the second terminal portion 1030.

According to the configuration, the first semiconductor chip 1002 and the second semiconductor chip 1003 are disposed face to face such that the first terminal portion 1020 and the second terminal portion 1030 confront each other. Then the terminal portion 1031 for signals, which is to serve as the external terminal of the first semiconductor chip 1002, is formed in the side region of the first semiconductor chip 1002. Further, the terminal portion 1031 for signals is utilized as the wire bonding portion, thus to achieve connection to the external connection terminal 1040 via the wire W.

In addition, another example of such technique is disclosed in JP-A Laid Open No. 2000-252408. A semiconductor device disclosed therein is shown in FIG. 12. FIG. 12 is a schematic cross-sectional view showing a conventional chip-on-chip structure in which an insulating film is employed.

The chip-on-chip structure includes a first semiconductor chip 411 and a second semiconductor chip 417. Between the first semiconductor chip 411 and the second semiconductor chip 417, an insulating film 414 is interposed. The insulating film 414 includes a structure that an interconnect pattern 416 and an interconnect pattern 420 is provided in the film 415.

The interconnect pattern 416 is provided with a connection portion 423 at a lower surface thereof. The connection portion 423 is connected to a bump 413a of the first semiconductor chip 412, formed on a surface 412 of the first semiconductor chip. The interconnect pattern 416 is also provided with a connection portion 424 on an upper surface thereof. The connection portion 424 is connected to a bump 419a of the second semiconductor chip, located on a surface 418 of the second semiconductor chip.

The interconnect pattern 420 is provided with a connection portion 427 at a lower surface thereof. The connection portion 427 is connected to a bump 413c of the first semiconductor chip, located on a surface 412 of the first semiconductor chip. The interconnect pattern 420 is also provided with a connection portion 426 on an upper surface thereof. The connection portion 426 is connected to a bump 419b of the second semiconductor chip, located on a surface 418 of the second semiconductor chip.

According to JP-A Laid Open No. 2000-252408, the described structure enables stacking and connecting semiconductor chips that have a different interval between electrodes or different electrode positions, thereby offering a higher degree of freedom in designing a chip-on-chip type semiconductor device.

SUMMARY OF THE INVENTION

However, it has now been discovered by the present inventors that the techniques disclosed in the cited documents have the following drawbacks.

Firstly, the semiconductor device 1001 according to the JA-A Laid Open No. 2000-22074 imposes a certain restriction on the degree of freedom with respect to a combination of a chip size between the first semiconductor chip 1002 and the second semiconductor chip 1003. For example, when employing a general semiconductor chip as the first semiconductor chip 1002 and the second semiconductor chip 1003, it is difficult to freely modify the chip size of the second semiconductor chip 1003 according to the chip size of the first semiconductor chip 1002, in most cases.

The chip size of the first semiconductor chip 1002 may be larger than that of the second semiconductor chip 1003. In such a case, it is difficult to form an electrode pad in a side region of the first semiconductor chip 1002, and hence to achieve external connection of the first semiconductor chip 1002.

Also, the first semiconductor chip 1002 and the second semiconductor chip 1003 are connected via the conductive balls 1071, however the resin component 1070 is also present in a gap between the conductive balls 1071. Accordingly, reliability and speed in signal transmission between the first semiconductor chip 1002 and the second semiconductor chip 1003 still has a room for further improvement.

Secondly, the chip-on-chip structure according to the JP-A Laid Open No. 2000-252408 is not compatible with a wire bonding method, because the insulating film 414 doesn't have rigidity. Besides, the lack of rigidity in the insulating film 414 makes it difficult to secure dimensional stability in the manufacturing process.

According to the present invention, there is provided a semiconductor device comprising a first semiconductor chip; a second semiconductor chip provided on the first semiconductor chip; a plate-shaped component formed between the first semiconductor chip and the second semiconductor chip, and the plate-shaped component including a projecting portion projecting farther outward than an outer periphery of the second semiconductor chip; wherein the first semiconductor chip includes a first electrode pad on a surface thereof facing the plate-shaped component; the second semiconductor chip includes a second electrode pad and a third electrode pad on a surface thereof facing the plate-shaped component; and the plate-shaped component includes a through electrode for connecting the first electrode pad and the second electrode pad, a fourth electrode pad disposed on a surface of the projecting portion facing the second semiconductor chip, and an interconnect for connecting the third electrode pad and the fourth electrode pad.

According to the present invention, the plate-shaped component is provided with the through electrode that connects the first electrode pad and the second electrode pad. Accordingly, the first semiconductor chip and the second semiconductor chip can be connected with a shorter path via the through electrode, which allows increasing the reliability and speed in signal transmission between the semiconductor chips.

Also, since the plate-shaped component includes the interconnect that connects the third electrode pad and the fourth electrode pad, the interconnect for connection to the third electrode pad on the plate-shaped component side surface of the second semiconductor chip can be led out as far as the fourth electrode pad formed farther outward than an outer periphery of the second semiconductor chip, irrespective of a chip size combination between the first semiconductor chip and the second semiconductor chip. Further, connecting the fourth electrode pad to a desired position makes it possible to also connect the third electrode pad to the desired position via the interconnect and the fourth electrode pad. Therefore, the degree of freedom can be increased in the selection of a semiconductor chip size and interconnect arrangement.

Also, according to the present invention, a plate-shaped component that has sufficient rigidity is employed, which provides a stable connection when connecting a wire by wire bonding or the like to the fourth electrode pad disposed on the projecting portion of the plate-shaped component. Therefore, the routing can be stably executed under a higher degree of freedom in the arrangement.

Features of the present invention have been described as above, regarding which it is to be understood that any optional combination of such features is also included in the scope of the present invention. Also, a conversion of an expression in the present invention into another category is also duly included in the scope of the present invention.

For example, the semiconductor device including the multichip stack structure according to the present invention may include two or more levels of semiconductor chips, without limiting to a two-level stack structure. Specifically, the stack structure may include three levels or four levels for example.

Also, the through electrode connected to the first electrode pad and the second electrode pad is directly connected to the both thereof, but a different configuration may also be adopted. For example, the through electrode may be electrically connected via an electrode pad, a bump, an interconnect, or another conductive material. Any of such cases is included in the configuration according to the present invention that the through electrode is connected to the first electrode pad and the second electrode pad.

In the present invention, the through electrode may be connected to the first electrode pad and the second electrode pad respectively with a bump bonding.

According to the configuration, since the first semiconductor chip and the second semiconductor chip can be connected via a shorter path, the resistance and capacitance of the interconnect can be reduced. This also improves the reliability and speed in signal transmission between the first semiconductor chip and the second semiconductor chip, thus realizing a reliable high-speed data transmission between the semiconductor chips.

In the present invention, the through electrode, which is connected with the first electrode pad and the second electrode pad respectively with a bump bonding may be directly connected between the ends of the through electrode and the first electrode pad and the second electrode pad via a bump constituted of a soldering material or the like, however a different arrangement may be made. For example, an additional electrode pad provided at the ends of the through electrode may be connected via the bump to the first electrode pad and the second electrode pad. Any of such cases is included in the configuration according to the present invention that the through electrode is connected to the first electrode pad and the second electrode pad with a bump bonding.

Also, the plate-shaped component may be a plate-shaped spacer.

According to the configuration, the plate-shaped spacer provides, because of having sufficient rigidity, a stable base for connecting the fourth electrode pad by wire bonding or the like at a desired position on the projecting portion of the plate-shaped spacer. Therefore, a highly reliable semiconductor device that offers a higher degree of freedom in routing arrangement may be obtained.

Also, the plate-shaped component may be a silicon spacer.

According to the configuration, the silicon spacer allows, because of having sufficient rigidity, connecting the second electrode pad by wire bonding or the like at a desired position on the projecting portion of the silicon spacer. Such structure increases the degree of freedom in routing arrangement, and provides a semiconductor device that is stable during the manufacturing process, and hence highly reliable.

Also, in the case where the plate-shaped component is a silicon spacer, the first semiconductor chip and the second semiconductor chip may also be constituted as a silicon semiconductor chip.

According to the configuration, a linear expansion coefficient of the silicon spacer is substantially the same as that of the first semiconductor chip and the second semiconductor chip, which are silicon semiconductor chips. Accordingly, such structure restrains stripping that may be caused by temperature fluctuation, thereby increasing the reliability of the semiconductor device.

Further, the fourth electrode pad may be formed farther outward than an outer periphery of the first semiconductor chip.

According to the configuration, a more extensive space is secured around the fourth electrode pad, which increases the degree of freedom in arranging the connection to the fourth electrode pad.

Further, the fourth electrode pad may be connected with wire bonding.

The semiconductor device thus constructed allows connecting the fourth electrode pad to a desired position with wire bonding, thereby increasing the degree of freedom in selecting a position to which the fourth electrode pad is to be connected.

The semiconductor device according to the present invention may further include a substrate, so that the first semiconductor chip is provided on the substrate, with the second semiconductor chip provided on the first semiconductor chip.

According to the configuration, the fourth electrode pad disposed on the second semiconductor chip-side face of the projecting portion of the plate-shaped component results formed on an upper surface of the projecting portion of the plate-shaped component. Accordingly, an open space is secured above the fourth electrode pad, which further increases the degree of freedom in arranging connection to the fourth electrode pad. For example, a wire bonding may be advantageously employed.

Further, the semiconductor device according to the present invention may further include a reinforcing component formed on the substrate, for sustaining the plate-shaped component at the projecting portion.

According to the configuration, the projecting portion of the plate-shaped component obtains an increased strength, which allows effectively connecting the fourth electrode pad with wire bonding or the like at a desired position on the projecting portion of the plate-shaped component. Such structure increases the degree of freedom in routing arrangement, and provides a semiconductor device that is stable during the manufacturing process, and hence highly reliable.

Still further, the semiconductor device according to the present invention may further include a reinforcing component formed on the first semiconductor chip for sustaining the plate-shaped component at the projecting portion.

According to the configuration, the reinforcing component may still be provided for sustaining the plate-shaped component at the projecting portion, even when the projecting portion of the plate-shaped component is disposed at an inner position than a periphery of the first semiconductor chip. Accordingly, the projecting portion of the plate-shaped component obtains an increased strength, which allows effectively connecting the fourth electrode pad with wire bonding or the like at a desired position on the projecting portion of the plate-shaped component. Such structure increases the degree of freedom in routing arrangement, and provides a semiconductor device that is stable during the manufacturing process, and hence highly reliable.

Still further, in the case where the semiconductor device includes the mentioned substrate, the substrate may be provided with a fifth electrode on an upper surface thereof, so that the fourth electrode pad may be connected to the fifth electrode pad with wire bonding.

The semiconductor device thus constructed allows disposing the third electrode pad of the second semiconductor chip at a farther outer position than an outer periphery of the second semiconductor chip, thereby facilitating connection of the third electrode pad via the fourth electrode pad to the fifth electrode pad on the substrate with wire bonding, irrespective of a chip size combination between the first semiconductor chip and the second semiconductor chip. Accordingly, there is provided a semiconductor device including a multichip stack structure, which offers a higher degree of freedom in selecting a chip size of the semiconductor chip and arranging the routing, and thereby increases the reliability and speed in signal transmission between the semiconductor chips.

Still further, the first semiconductor chip may be a memory chip, and the second semiconductor chip may be a logic chip.

The semiconductor device thus constructed also allows disposing the third electrode pad of the second semiconductor chip at a farther outer position than an outer periphery of the second semiconductor chip, thereby facilitating connection of the third electrode pad via the fourth electrode pad to a desired position by wire bonding, even when stacking a memory chip which tends to be smaller in dimensions and a logic chip which tends to be larger in dimensions. Accordingly, there is provided a semiconductor device including a multichip stack structure, which offers a higher degree of freedom in selecting a chip size of the semiconductor chip and arranging the routing, and thereby increases the reliability and speed in signal transmission between the semiconductor chips.

According to the present invention, there is provided a semiconductor device including a plurality of stacked semiconductor chips, which offers a higher degree of freedom in selecting a chip size of the semiconductor chip and arranging the routing, and thereby increases the reliability and speed in signal transmission between the semiconductor chips.

BRIEF DESCRIPTION OF THE DRAWINGS

The above and other objects, advantages and features of the present invention will be more apparent from the following description taken in conjunction with the accompanying drawings, in which:

FIG. 9 is a schematic cross-sectional view showing a ball grid alley structure applied to a semiconductor device including the multichip stack structure according to the first embodiment;

FIG. 10 is a schematic cross-sectional view showing a multichip stack structure based on a flip chip connection;

DETAILED DESCRIPTION OF THE INVENTION

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereunder, description will be given regarding embodiments of the present invention, with reference to the accompanying drawings. Throughout the drawings, similar constituents will be given an identical numeral, and description thereof will be omitted as the case may be.

First Embodiment

Figure 1:
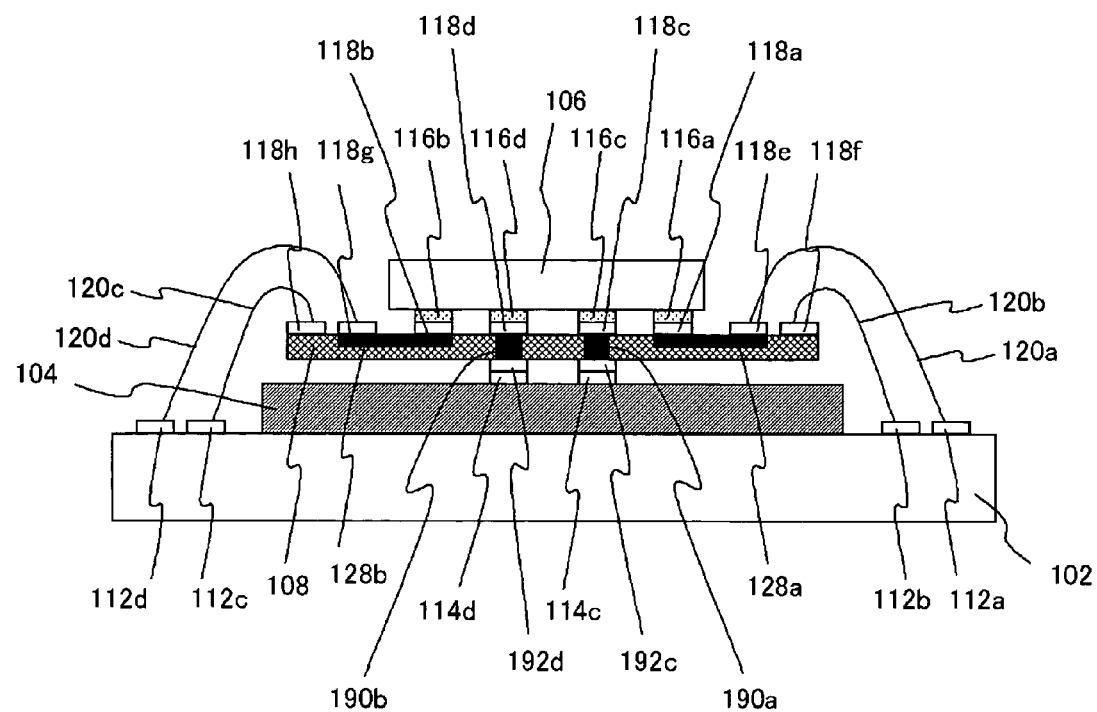
FIG. 1 is a schematic cross-sectional view showing a multichip stack structure according to a first embodiment of the present invention.

FIG. 1 is a schematic cross-sectional view showing a multichip stack structure according to the first embodiment.

A semiconductor device 100 includes a substrate 102, on which a semiconductor chip 104 and a semiconductor chip 106 are provided. Between the semiconductor chip 104 and the semiconductor chip 106, a silicon spacer 108 is interposed.

Here, a kind or nature of the semiconductor chip 104 and the semiconductor chip 106 is not specifically limited, and a silicon chip constituted of a similar material to that of the silicon spacer 108 may be employed. Alternatively, the semiconductor chip 104 may be a memory chip such as a DRAM, while the semiconductor chip 106 may be a logic chip such as an application-specific IC (ASIC).

The substrate 102 is provided with electrode pads 112a, 112b, 112c, and 112d on an upper surface thereof. The semiconductor chip 104 is provided with electrode pads 114c and 114d on an upper surface thereof. The semiconductor chip 106 is provided with electrode pads 116a, 116b, 116c, and 116d on a lower surface thereof.

The silicon spacer 108 includes through electrodes 190a and 190b penetrating the silicon spacer 108. The silicon spacer 108 is provided with a rerouting 128a and a rerouting 128b which have the respective ends thereof inside and outside an outer periphery of the semiconductor chip 106. The silicon spacer 108 is provided with electrode pads 118a, 118b, 118c, 118d, 118e, 118f, 118g, and 118h on an upper surface thereof. On a lower surface of the silicon spacer 108, electrode pads 192c and 192d are provided.

The electrode pad 118c is connected to an upper end of the through electrode 190a. The electrode pad 118d is connected to an upper end of the through electrode 190b. The electrode pad 192c is connected to a lower end of the through electrode 190a. The electrode pad 192d is connected to a lower end of the through electrode 190b.

The electrode pad 118a is formed inside the outer periphery of the semiconductor chip 106, and connected to the inner end of the rerouting 128a. The electrode pad 118e is formed outside the outer periphery of the semiconductor chip 106, and connected to the outer end of the rerouting 128a. The electrode pad 118f is formed farther outward than the electrode pad 118e.

The electrode pad 118b is formed inside the outer periphery of the semiconductor chip 106, and is connected to the inner end of the rerouting 128b. The electrode pad 118g is formed outside the outer periphery of the semiconductor chip 106, and connected to the outer end of the rerouting 128b. The electrode pad 118h is formed farther outward than the electrode pad 118g.

The electrode pads 114c and 114d on the semiconductor chip 104, which constitutes the lower stack, are directly connected to electrode pads 192c and 192d respectively, which are conductive with the through electrodes 190a and 190b of the silicon spacer 108.

The electrode pads 116c and 116d on the semiconductor chip 106, which constitutes the upper stack, are directly connected to the electrode pads 118c and 118d respectively, which are conductive with the through electrodes 190a and 190b of the silicon spacer 108.

The electrode pad 114c of the lower semiconductor chip 104, the electrode pad 192c of the silicon spacer 108, the through electrode 190a, the electrode pad 118c, and the electrode pad 116c of the upper semiconductor chip 106 are substantially aligned along a single straight line.

In the present invention, the expression of "aligned along a single straight line" does not mean that those constituents are perfectly aligned on an identical straight line in a geometrically strict sense. Instead, this expression describes a configuration that those constituents are formed along a straight line or very close to the straight line, such as substantially on a straight line from a practical view point. In other words, these constituents are formed at an identical position or very close to a single point in a plan view.

Likewise, the electrode pads 116a and 116b of the upper semiconductor chip 106 are directly connected to the electrode pads 118a and 118b respectively, which are conductive with the inner end of the rerouting 128a and 128b of the silicon spacer 108.

The electrode pads 118f, 118h of the silicon spacer 108 are respectively connected to the electrode pads 112b and 112c provided on an upper surface of the substrate 102, via wires 120b and 120c.

The electrode pads 118e and 118g of the silicon spacer 108 are respectively connected to the electrode pads 112a and 112d provided on an upper surface of the substrate 102, via wires 120a and 120d.

The advantageous effect of the semiconductor device 100 according to this embodiment will now be described hereunder.

The silicon spacer 108 of the semiconductor device 100, interposed between the semiconductor chips 104 and 106, is larger in dimensions than the upper semiconductor chip 106.

From a different viewpoint, in the semiconductor device 100 the silicon spacer 108 interposed between the semiconductor chips 104 and 106 includes the projecting portion projecting farther outward than the outer periphery of the semiconductor chip 106.

Accordingly, the electrode pads 116a and 116b disposed on a lower surface of the upper semiconductor chip 106 can be respectively drawn out to the electrode pads 118e, 118g formed on the projecting portion of the silicon spacer 108, on both sides of the semiconductor device 100.

Such configuration of the semiconductor device 100 allows performing wire bonding between the electrode pads 118e and 118g on the silicon spacer 108 and the electrode pads 112a and 112b on the substrate 102 respectively, thus to achieve connection between the upper semiconductor chip 106 and the substrate 102.

Also, in the semiconductor device 100, the silicon spacer 108 that is smaller in dimensions than the semiconductor chip 104 is used. Accordingly, the structure of the semiconductor device 100 becomes stable from a structural-mechanical viewpoint. In addition, a space that is an upper portion of periphery of the semiconductor chip 106 is expanded, which enables performing wire bonding for additional electrode pads that may be disposed around the periphery of the semiconductor chip 106, as will be subsequently described.

The above having been stated, the dimensions of the silicon spacer 108 may be larger than that of the semiconductor chip 104. In this case also, the semiconductor chip 104 and the semiconductor chip 106 can equally be connected via the through electrodes 190a, 190b provided in the silicon spacer 108. In addition, forming a supporting component that sustains the silicon spacer 108 as described later, the semiconductor device 100 remains structural-mechanically stable.

Figure 11:
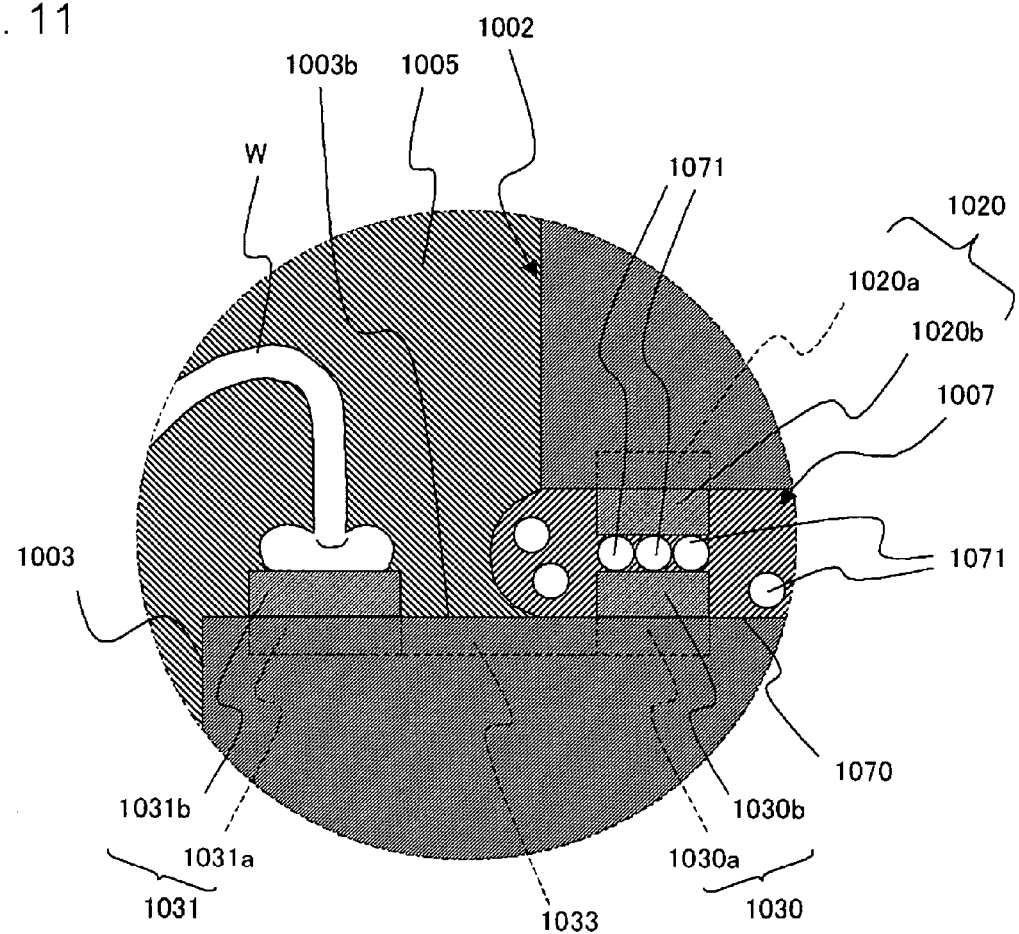
FIG. 11 is an enlarged cross-sectional view showing the multichip stack structure of FIG. 10.

By contrast, with respect to the conventional multichip stack structure shown in FIGS. 10 and 11, which is not provided with a spacer, a rerouting has to be provided on an upper surface of the lower semiconductor chip, in order to lead out the interconnect. To carry out the rerouting on an upper surface of the semiconductor chip, it is necessary to form a rerouting layer, for example by metal plating on an upper surface of the lower semiconductor chip, by metal vapor deposition or by sticking a metal foil formed in a predetermined shape.

For such reason, in a conventional stack structure it is impossible to employ a general memory chip or the like as the lower semiconductor chip, but a customized memory chip to which a special processing is applied has to be employed instead. Accordingly, a designing span of the semiconductor device is prolonged, besides an additional manufacturing cost is often required.

Unlike such a conventional structure, the semiconductor device 100 shown in FIG. 1 allows leading out the interconnect because of the rerouting 128 provided in the silicon spacer 108, which eliminates the need to perform a rerouting on an upper surface of the lower semiconductor chip to enable the wire bonding, as is the case with the conventional multichip stack structure shown in FIGS. 10 and 11.

Therefore, the semiconductor device 100 shown in FIG. 1 does not require a use of a customized memory chip or the like as the lower semiconductor chip 104, but accepts a general memory chip as it is. Consequently, an increased degree of freedom can be secured in designing the semiconductor device 100, and the manufacturing cost can also be reduced. Besides, since a general chip can be utilized as it is, the development span of the semiconductor device 100 can be shortened.

Also, in the case of the conventional multichip stack structure shown in FIGS. 10 and 11 which does not include a spacer, for example, when the lower semiconductor chip is smaller in dimensions than the upper semiconductor chip, it is difficult to provide an electrode pad by the side of the upper semiconductor chip, and hence to lead out an electrode pad of the upper semiconductor chip for achieving a connection.

On the other hand, in the semiconductor device 100 shown in FIG. 1, the upper semiconductor chip 106 may be either larger or smaller in dimensions than the lower semiconductor chip 104. Therefore, the semiconductor device 100 enables easily connecting the semiconductor chip 106 to the substrate 102, without any restriction originating from a combination of the chip size of the upper and lower semiconductor chips.

Also, in the semiconductor device 100 shown in FIG. 1, the through electrodes 190a, 190b of the silicon spacer 108 are respectively connected to the electrode pads 116c and 116d of the upper semiconductor chip 106, via the electrode pads 118c, 118d of the silicon spacer 108 with a bump bonding. It is to be noted that FIG. 1 does not specifically show the solder bump between the electrode pads, which is also the case with other drawings.

Likewise, the through electrodes 190a and 190b of the silicon spacer 108 are respectively connected to the electrode pads 114c and 114d of the lower semiconductor chip 104, via the electrode pads 192c and 192d of the silicon spacer 108 with a bump bonding.

Such configuration achieves excellent conductivity in the connection of the upper semiconductor chip 106 and the lower semiconductor chip 104, through substantially a shortest path. Consequently, the structure significantly increases reliability and speed in a signal transmission between the upper semiconductor chip 106 and the lower semiconductor chip 104, in comparison with a structure connected with wire bonding or the like.

A thickness of the silicon spacer 108 may be in a range of 50 μm to 100 μm, for example. If a thickness of the silicon spacer 108 is within such range, the silicon spacer 108 can be secured sufficient rigidity. Therefore, a sufficiently thin multichip stack structure can be obtained.

Further, the silicon spacer 108 of a thickness in such range facilitates executing wire bonding for connection with an external component free from restriction by a chip size combination in a semiconductor device including a chip-on-chip (COC), multi-chip package (MCP), three-dimensional system-in-a-package (SiP) structure or the like, thereby achieving high-speed signal transmission between the semiconductor chips, thus leading to accomplishment of a thin, yet highly integrated semiconductor chip package.

Further, in the semiconductor device 100, the lower semiconductor chip 104 and the upper semiconductor chip 106 are connected in a face-down configuration, which eliminates the need to perform wire bonding with the upper semiconductor chip 106. Accordingly, a portion of the thickness corresponding to the wire can be saved, and resultantly an overall thickness of the multichip stack structure can be made thinner for achievement of a smaller package. In addition, a signal path length between two chips is shortened, by which a signal transmission speed is increased and the characteristics of the upper and lower semiconductor chips can be more efficiently exhibited.

Figure 12:
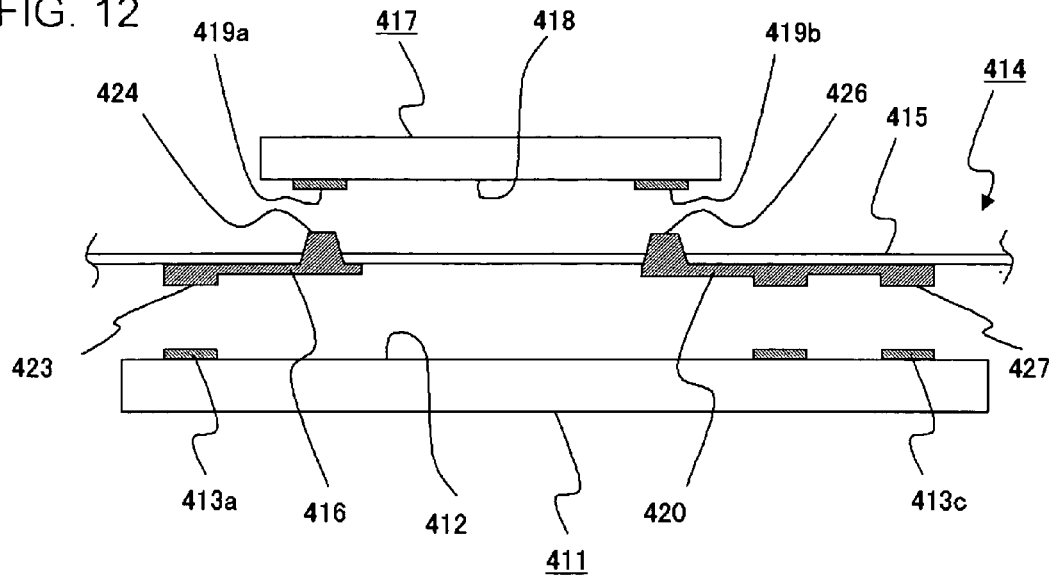
FIG. 12 is a schematic cross-sectional view showing a chip-on-chip structure in which an insulating film is employed.

By contrast, the conventional COC structure shown in FIG. 12 employs a film insulator which is flexible. Accordingly, in the case of disposing an electrode pad on the film insulator, it is difficult to achieve the connection with wire bonding.

On the other hand, the silicon spacer 108 is a rigid plate-shaped component, and wire bonding with the electrode pads 118e, 118f, 118g, and 118h can be advantageously performed.

Also, in the case where the lower semiconductor chip 104 and the upper semiconductor chip 106 are both silicon chips as the semiconductor device 100 shown in FIG. 1, the silicon spacer 108 has substantially the same linear expansion coefficient as the lower semiconductor chip 104 and the upper semiconductor chip 106.

Accordingly, even under a temperature fluctuation, the semiconductor device 100 prevents deterioration in contact characteristic between the electrode pads disposed on the lower semiconductor chip 104, silicon spacer 108 and the upper semiconductor chip 106, and stripping of these electrode pads, unlike the conventional COC structure shown in FIG. 12 in which a film insulator is employed.

Further, in the semiconductor device 100 shown in FIG. 1, the upper semiconductor chip 106 may be a circuit chip such as an ASIC, and the lower semiconductor chip 104 may be a memory chip such as a DRAM or a SRAM.

Now, a size of a circuit chip such as an ASIC largely depends on a width and pitch of interconnects integrally incorporated therein. Accordingly, a size of a circuit chip such as an ASIC is becoming smaller along with the micronization of interconnect patterns. On the other hand, a memory chip such as a DRAM or a SRAM tends to be larger in dimensions, in accordance with the demand for a larger capacity.

When stacking a small circuit chip and a large memory chip to constitute a semiconductor device, stacking the smaller circuit chip on the larger memory chip in a flip chip (face down) configuration such that the respective terminal portions thereof oppose to each other provides structural-mechanical stability.

In this case, however, when the foregoing plate-shaped component is not employed, the main face (the face on which the terminal portion is provided) of the upper circuit chip is oriented downward, thus the main face of the upper circuit chip is covered with the main face (the face on which the terminal portion is provided) of the lower memory chip. This makes it difficult to secure a terminal portion for performing the wire bonding on the main face of the upper circuit chip.

A terminal portion for exchange of a charge (electricity or a signal) between the upper circuit chip and the lower memory chip may be downwardly oriented as long as conductivity is secured. However, in the case of a terminal portion to be utilized for wire bonding, it is preferable that at least an upper face thereof is exposed. For example, connection of a terminal portion for the upper circuit chip such as an ASIC to perform signal transmission with an eternal region is normally made via wire bonding with a terminal for packaging. Accordingly, it is desirable that an upper face of a terminal portion of the upper circuit chip such as an ASIC is exposed.

For such purpose, providing a portion for wire bonding on an upper face (rear surface) of the circuit chip such as an ASIC might be a choice, however it is technically difficult to form an interconnect pattern (terminal portion) on both sides of a circuit chip such as an ASIC.

Likewise, it could be an option to provide a rerouting on an upper face (main face) of the memory chip such as a DRAM or a SRAM, and to lead out an interconnect from a terminal portion on the main face of the circuit chip. In this case, methods of providing the rerouting on the upper face of the lower semiconductor chip may include metal plating on an upper face of the lower semiconductor chip, metal vapor deposition, sticking a metal foil having a predetermined shape, and so forth.

However, in any of such cases it is impossible to employ a general purpose memory chip as the lower semiconductor chip, but instead a customized memory chip to which a special treatment is applied, such as metal vapor deposition, has to be employed. Accordingly, a lead time for designing and manufacturing of the semiconductor device is prolonged, besides a manufacturing cost is often increased.

On the contrary, the semiconductor device 100 shown in FIG. 1 does not require a use of a customized memory chip or the like as the lower semiconductor chip 104, but accepts a general memory chip as it is. Therefore, a degree of freedom can be increased in designing the semiconductor device 100, and the manufacturing cost can also be reduced. Besides, since a general chip can be utilized as it is, the development span of the semiconductor device 100 and the lead time manufacturing the semiconductor device 100 can be shortened.

Also, the semiconductor device 100 allows connection of the upper circuit chip such as an ASIC with wire bonding, so as to enable direct signal transmission/reception with an external region, and high-speed data transmission/reception with the lower memory chip because of the flip-chip configuration. Therefore, a degree of freedom can be increased in designing the semiconductor device 100, and reliability and speed in the operation of the semiconductor device 100 can be increased.

FIG. 9 is a schematic cross-sectional view showing a ball grid alley (BGA) structure applied to a semiconductor device including the multichip stack structure according to the first embodiment.

When applying a BGA structure to the multichip stack structure according to this embodiment, electrode pads 136 are provided on a rear surface of the substrate 102, and a solder ball 138 is formed on the respective electrode pads 136. The electrode pads 136 may be connected to the electrode pads 112a, 112b, 112c, and 112d and the like in FIG. 1, for example.

Also, an entirety of the multichip stack structure is sealed in a sealing resin layer 132. Here, a gap between the lower semiconductor chip 104 and the silicon spacer 108 in the FIG. 1 is sealed by an underfilling resin layer 134a. In addition, a gap between the upper semiconductor chip 106 and the silicon spacer 108 is sealed by an underfilling resin layer 134b.

FIGS. 2A to 3E are schematic cross-sectional views sequentially showing a manufacturing process of the multichip stack structure according to the first embodiment.

Figure 2A:
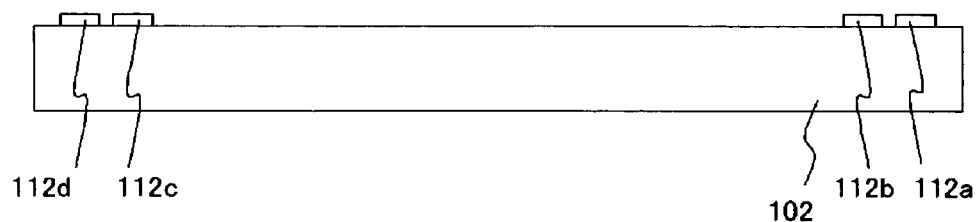
FIGS. 2A to 2C are schematic cross-sectional view sequentially showing a manufacturing process of the multichip stack structure according to the first embodiment.

For obtaining the multichip stack structure according to the first embodiment, the electrode pads 112a, 112b, 112c, and 112d are first formed on the substrate 102, as shown in FIG. 2A.

Figure 2B:
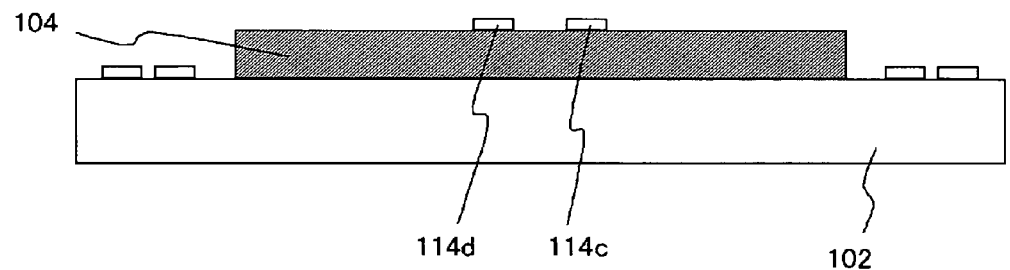

Then the lower semiconductor chip 104 is stacked on the upper surface of substrate 102, as shown in FIG. 2B. The semiconductor chip 104 is provided with the electrode pads 114c and 114d formed in advance on the upper surface (main face) thereof.

Figure 2C:
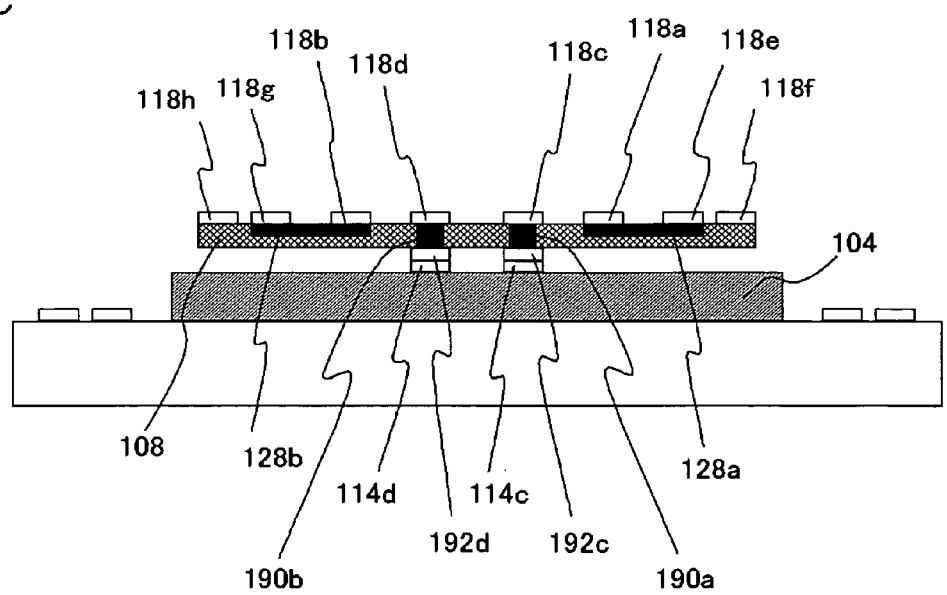

The silicon spacer 108 is then formed on the semiconductor chip 104 as shown in FIG. 2C. In the silicon spacer 108, the through electrodes 190a and 190b and the reroutings 128a and 128b are formed through the techniques to be subsequently described.

At this stage, the electrode pads 114c and 114d on the upper surface of the lower semiconductor chip 104 and the electrode pads 192c and 192d provided at the lower end of the through electrodes 190a, 190b in the silicon spacer 108 are respectively connected with a bump bonding.

On the upper surface of the silicon spacer 108, also the electrode pads 118a, 118b, 118c, 118d, 118e, 118f, 118g, and 118h are provided in advance. The electrode pads 118c and 118d are formed on the upper end of the through electrodes 190a, 190b, respectively. The electrode pads 118a and 118b are formed at the inner end of the reroutings 128a and 128b, respectively. The electrode pads 118e and 118g are formed at the outer end of the reroutings 128a and 128b, respectively. The electrode pads 118f and 118h are formed at a position outer than the electrode pads 118e, 118g.

Figure 3D:
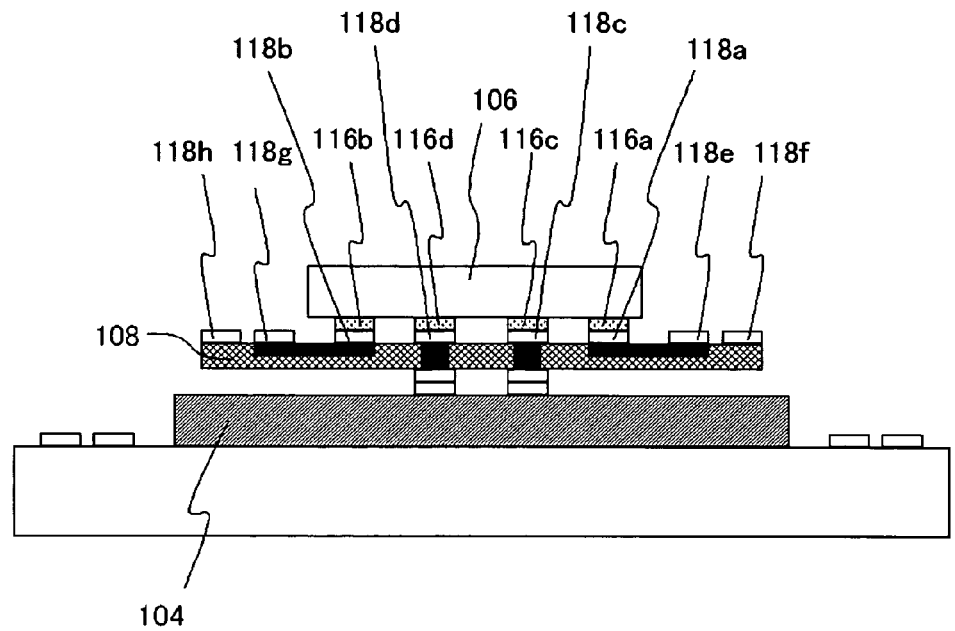
FIGS. 3D and 3E are schematic cross-sectional view sequentially showing a manufacturing process of the multichip stack structure according to the first embodiment.

Thereafter, as shown in FIG. 3D, the upper semiconductor chip 106 is stacked on the silicon spacer 108. On the lower surface (main face) of the upper semiconductor chip 106, the electrode pads 116a, 116b, 116c, and 116d are provided in advance.

At this stage, the electrode pads 116a, 116b, 116c, and 116d on the lower surface of the upper semiconductor chip 106 are respectively connected to the electrode pads 118a, 118b, 118c, and 118d on the silicon spacer 108 with a bump bonding.

Figure 3E:
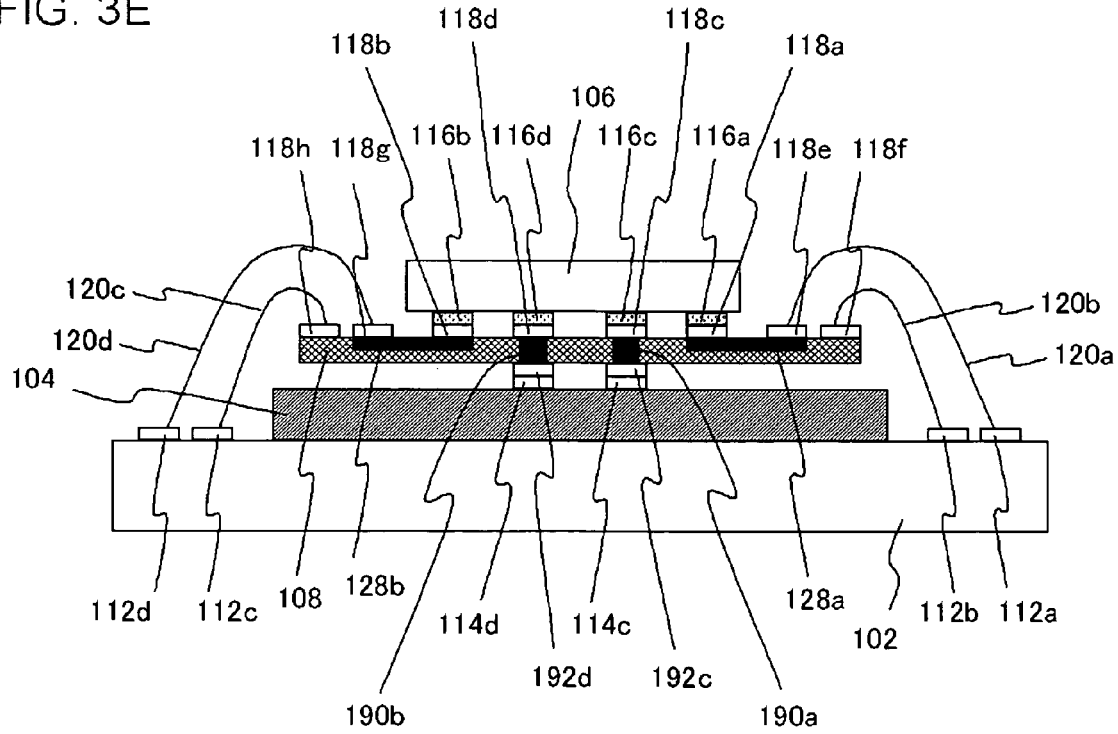

Then wire bonding is performed as shown in FIG. 3E. Specifically, the electrode pads 118e, 118f, 118g, and 118h on the upper (outer) surface of the silicon spacer 108 are respectively connected with wire bonding to the electrode pads 112a, 112b, 112d, and 112c on the substrate 102.

Since the foregoing method provides the silicon spacer 108 with the through electrodes 190a, 190b, the connection between the lower semiconductor chip 104 and the upper semiconductor chip 106 can be achieved with the through electrodes 190a and 190b via a short path, and excellent conductivity can be stably assured. Consequently, reliability and transmission speed in the signal transmission between the lower semiconductor chip 104 and the upper semiconductor chip 106 can be increased stably.

Also, the foregoing method provides the silicon spacer 108 with the rerouting 128a and 128b for connection between the electrode pads 118a and 118b and the electrode pads 118e and 118g respectively. Therefore, the rerouting 128a and 128b connected with the electrode pads 116a, 116b on the silicon spacer side surface of the upper semiconductor chip 106 via the electrode pads 118a, 118b can be lead out as far as the electrode pads 118e, 118g formed farther outward than the outer periphery of the upper semiconductor chip 106, irrespective of a chip size combination between the lower semiconductor chip 104 and the upper semiconductor chip 106.

Then connecting the electrode pads 118e and 118g to the electrode pads 112a and 112d on the upper surface of the substrate 102 via the wire 120a and 120d achieves connection between the electrode pads 116a and 116b and the electrode pads 112a and 112d on the upper surface of the substrate 102, via the electrode pads 118a and 118b, rerouting 128a and 128b and the electrode pads 118e and 118g respectively. Such configuration increases the degree of freedom in selecting a chip size of the lower semiconductor chip 104 and the upper semiconductor chip 106, and routing arrangement by the wire 120a and 120d.

Also, such configuration provides, when performing for example the wire bonding or the like for connection of the electrode pads 118e and 118g disposed on the projecting portion of the silicon spacer 108, a stable base for the connecting operation because of the rigidity of the silicon spacer 108. Therefore, a routing arrangement with wire bonding or the like, which provides a higher degree of freedom, can be stably performed.

Figure 8A:
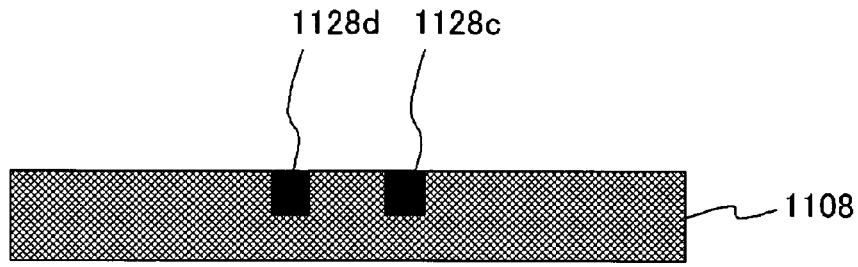
FIGS. 8A to 8C are schematic cross-sectional view sequentially showing a manufacturing process of the through electrode according to the first embodiment.
Figure 8B:
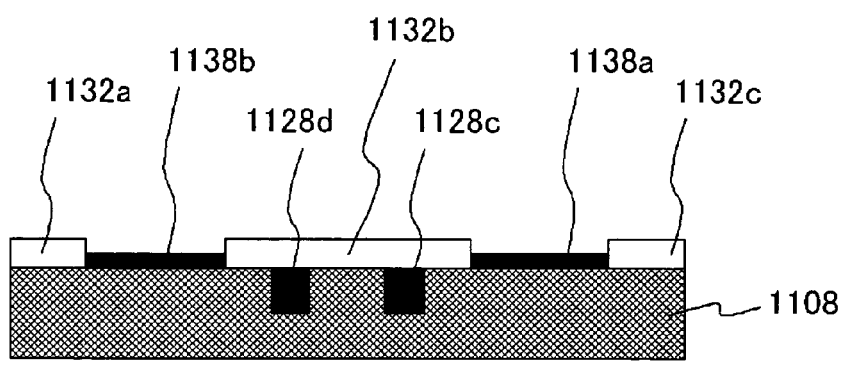
Figure 8C:
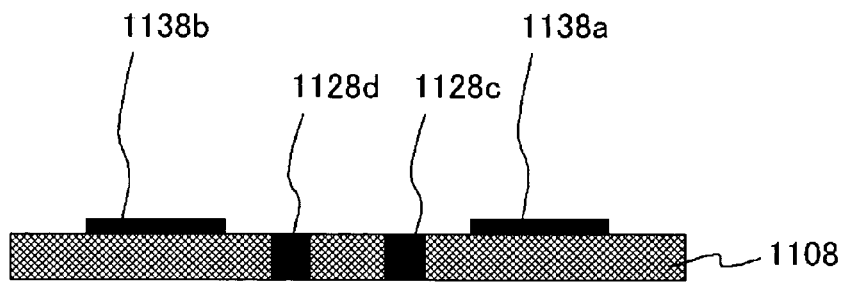

FIGS. 8A to 8C are schematic cross-sectional view sequentially showing a manufacturing process of the through electrode according to the first embodiment. Here, the upper surface in FIGS. 8A to 8C corresponds to the upper surface of the silicon spacer 108 (the upper surface in FIG. 1).

For forming the through electrode in the silicon spacer shown in the first embodiment, firstly a resist layer (not shown in the drawings) is provided on the silicon spacer 1108, and selective etching is performed on the silicon spacer 1108 utilizing the resist layer as a mask, so as to form a recessed portion on the upper surface of the silicon spacer 1108. Then a conductive material 1128c and 1128d is filled in the recessed portion as shown in FIG. 8A.

The conductive material may be a metal material containing Al or Cu, for example. Such conductive material may be formed for example by plating technique. Also, the conductive material may be provided with a barrier metal layer constituted of TiN or the like, on a bottom face and a side wall thereof.

Then as shown in FIG. 8B, resist layers 1132a, 1132b, and 1132c are provided on the upper surface of the silicon spacer 1108. The resist layers are formed so as to cover the upper surface of the conductive materials 1128c and 1128d and a neighboring region thereon. The resist layers are also formed with an opening defined at a position where a rerouting is to be provided. Such opening is filled with a conductive material 1138a and 1138b constituted of a metal material containing Al or Cu, for example by sputtering technique.

Then as shown in FIG. 8C, the resist layers 1132a, 1132b, and 1132c are stripped from the upper surface of the silicon spacer 1108, followed by back grinding from the lower surface of the silicon spacer 1108, for thinning the silicon spacer 1108 down to approx. 50 to 100 μm in thickness.

As a result, a lower end portion of the conductive material 1128c and 1128d is exposed and the through electrode is formed. After the back grinding, a finish polishing is applied to the lower surface of the silicon spacer 1108, thus obtaining the silicon spacer 1108 provided with the through electrode and the rerouting.

According to the first embodiment, employing the silicon spacer 1108 provided with the through electrode and the rerouting formed as above enables leading out the electrode pad on a lower surface of the upper semiconductor chip to the electrode pad on the upper (outer) surface of the silicon spacer, via the rerouting. Also, a flip chip connection can be achieved between the electrode pad on the upper surface of the lower semiconductor chip and the electrode pad on the lower surface of the upper semiconductor chip, via the through electrode.

Consequently, employing a silicon spacer constituted as above provides the semiconductor device 100 including the lower semiconductor chip 104 and the upper semiconductor chip 106 that are stacked as shown in FIG. 1, which offers a higher degree of freedom in selecting a chip size of the upper semiconductor chip 106 and the lower semiconductor chip 104, as well as in arranging the routing, and increase of the reliability and speed in signal transmission between the upper semiconductor chip 106 and the lower semiconductor chip 104.

Second Embodiment

Figure 4:
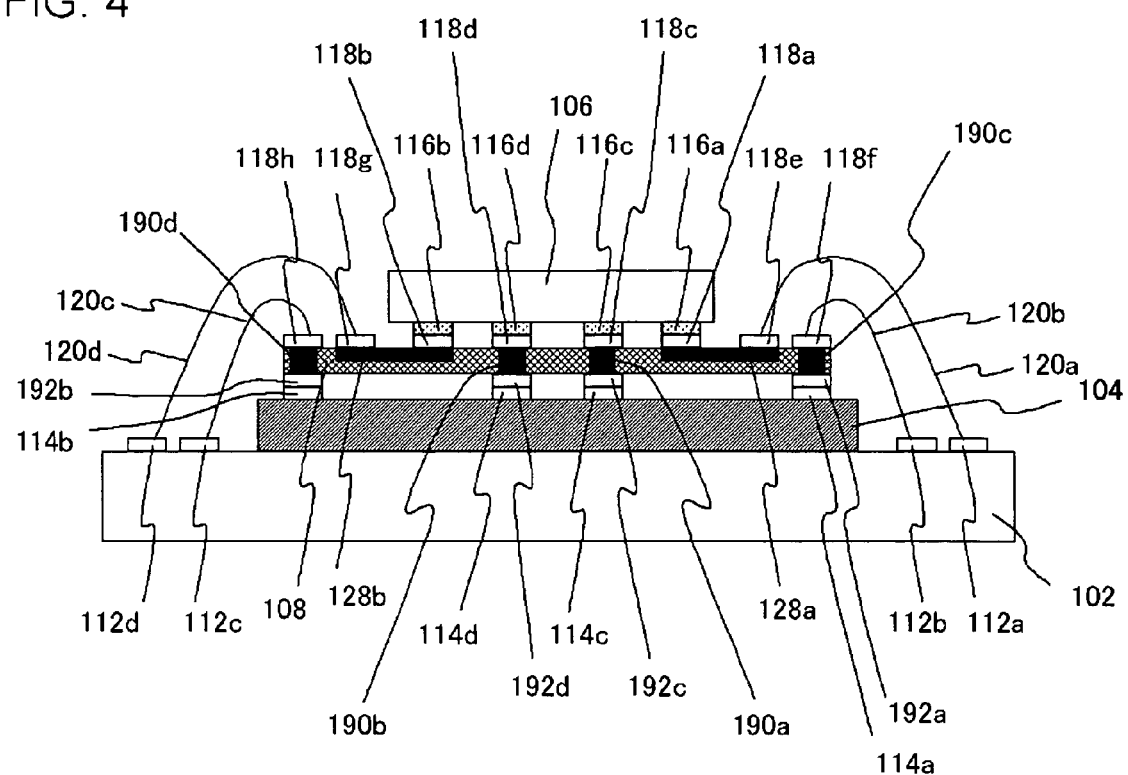
FIG. 4 is a schematic cross-sectional view showing a multichip stack structure according to a second embodiment.

FIG. 4 is a schematic cross-sectional view showing a multichip stack structure according to the second embodiment.

A multichip stack structure according to the second embodiment has a similar configuration to the first embodiment, but the through electrodes 190c and 190d are further provided in the silicon spacer 108.

At the upper end of the through electrodes 190c and 190d, the electrode pads 118f and 118h are respectively provided. Also, at the lower end of the through electrode 190c and 190d, electrode pads 192a and 192b are respectively provided.

Also, the lower semiconductor chip 104 is provided with electrode pads 114a and 114b on the upper surface thereof, which are respectively connected to the electrode pads 192a and 192b on the lower surface of the silicon spacer 108 with a bump bonding.

The electrode pads 118f and 118h on the upper surface of the silicon spacer 108 are respectively connected via the wire 120b and 120c to the electrode pads 112b and 112c formed on the upper surface of the substrate 102, with wire bonding.

Under such configuration, the electrode pads 114a and 114b disposed on the upper surface of the lower semiconductor chip 104 can be led out to the electrode pad 118f and 118h formed on the upper (outer) surface of the silicon spacer 108 respectively, via the electrode pads 192a and 192b and the through electrodes 190c and 190d provided in the silicon spacer 108.

The silicon spacer 108 may be either larger or smaller in dimensions in a plan view than the lower semiconductor chip 104. In other words, the silicon spacer 108 may be formed so as to reduce a space above the outer periphery of the lower semiconductor chip 104.

Accordingly, wire bonding to the lower semiconductor chip 104 can be performed via the electrode pad 118f and 118h on the silicon spacer 108, irrespective of a chip size combination with the lower semiconductor chip 104 and the silicon spacer 108. Consequently, the silicon spacer 108 thus constructed allows performing wire bonding to the lower semiconductor chip 104, without restriction originating from a chip size combination between the lower semiconductor chip 104 and the upper semiconductor chip 106.

Such configuration facilitates performing wire bonding free from restriction by a chip size combination, thereby achieving a thin, yet highly integrated semiconductor chip package, which is particularly advantageous for a semiconductor device including a COC, MCP, three-dimensional SiP structure or the like.

Also, under such configuration, the electrode pads 114a 114b are formed on the upper surface of the outer and periphery of the semiconductor chip 104, and the electrode pads 192a and 192b are formed on the lower surface of the projecting portion of the silicon spacer 108. Accordingly, the electrode pads 114a, 114b and the electrode pads 192a, 192b also serve as a supporting component for the silicon spacer 108. Consequently, the wire bonding to the electrode pads 118e, 118f, 118g, and 118h on the upper surface of the silicon spacer 108 can be stably performed.

Consequently, the configuration according to the second embodiment provides the semiconductor device 200 including the upper semiconductor chip 106 and the lower semiconductor chip 104 that are stacked, which offers a higher degree of freedom in selecting a chip size of the upper semiconductor chip 106 and the lower semiconductor chip 104, as well as in arranging the routing, and increase of the reliability and speed in signal transmission between the upper semiconductor chip 106 and the lower semiconductor chip 104.

Third Embodiment

Figure 5:
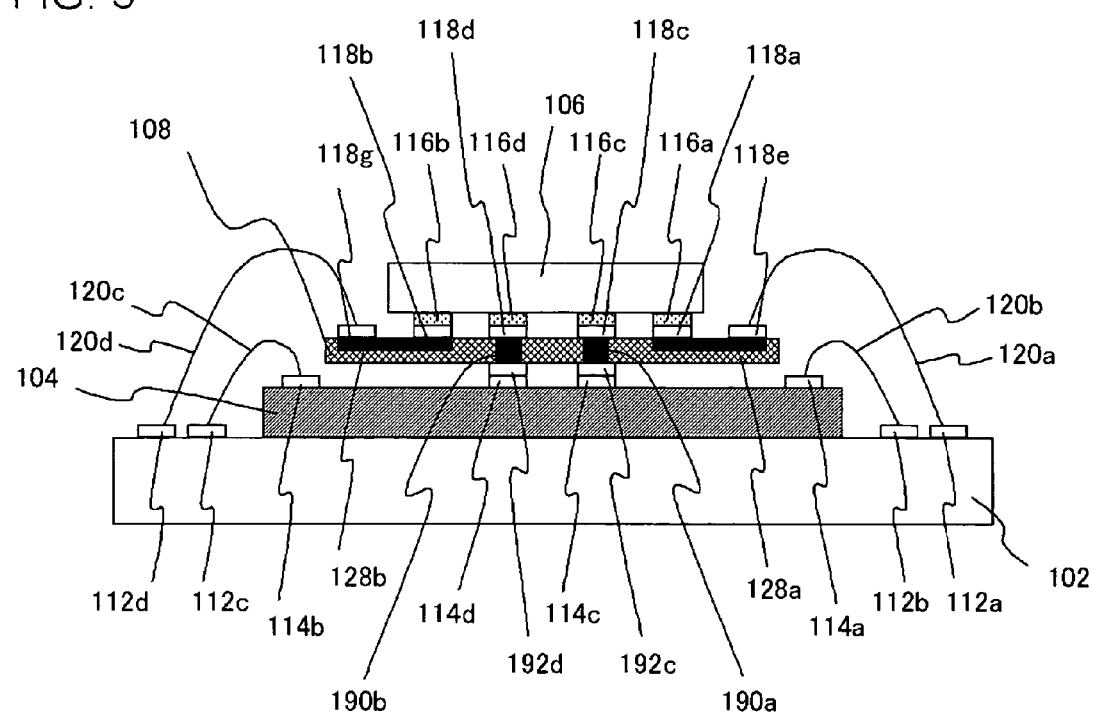
FIG. 5 is a schematic cross-sectional view showing a multichip stack structure according to a third embodiment.

FIG. 5 is a schematic cross-sectional view showing a multichip stack structure according to the third embodiment.

A semiconductor device 300 having a multichip stack structure according to the third embodiment has a similar configuration to the first embodiment, except for the electrode pads 114a and 114b provided at an upper surface of the outer periphery of the semiconductor chip 104.

These electrode pads 114a and 114b on the upper surface of the semiconductor chip 104 are respectively connected via the wire 120b and 120c to the electrode pads 112b and 112c formed on the upper surface of the substrate 102, with wire bonding.

In this embodiment, it is preferable that the silicon spacer 108 is smaller in dimensions in a plan view than the lower semiconductor chip 104. In other words, it is preferable that the silicon spacer 108 is not formed above the outer periphery of the lower semiconductor chip 104.

Such configuration allows performing direct wire bonding from the electrode pads 112b and 112c on the upper surface of the substrate 102 to the lower semiconductor chip 104. Accordingly, the semiconductor device 300 having such configuration can further increase the degree of freedom in arranging the routing to the lower semiconductor chip 104.

Especially in the semiconductor device including a COC, MCP, three-dimensional SiP structure or the like, since the configuration according to the present embodiment enables to increase a degree of freedom in arranging the routing with wire bonding, it is possible to increase a degree of freedom in designing a thin, highly integrated semiconductor package.

Consequently, the configuration according to the present embodiment provides the semiconductor device 300 including the upper semiconductor chip 106 and the lower semiconductor chip 104 that are stacked, which offers a higher degree of freedom in selecting a chip size of the upper semiconductor chip 106 and the lower semiconductor chip 104, as well as in arranging the routing, and increase of the reliability and speed in signal transmission between the upper semiconductor chip 106 and the lower semiconductor chip 104.

Fourth Embodiment

Figure 6:
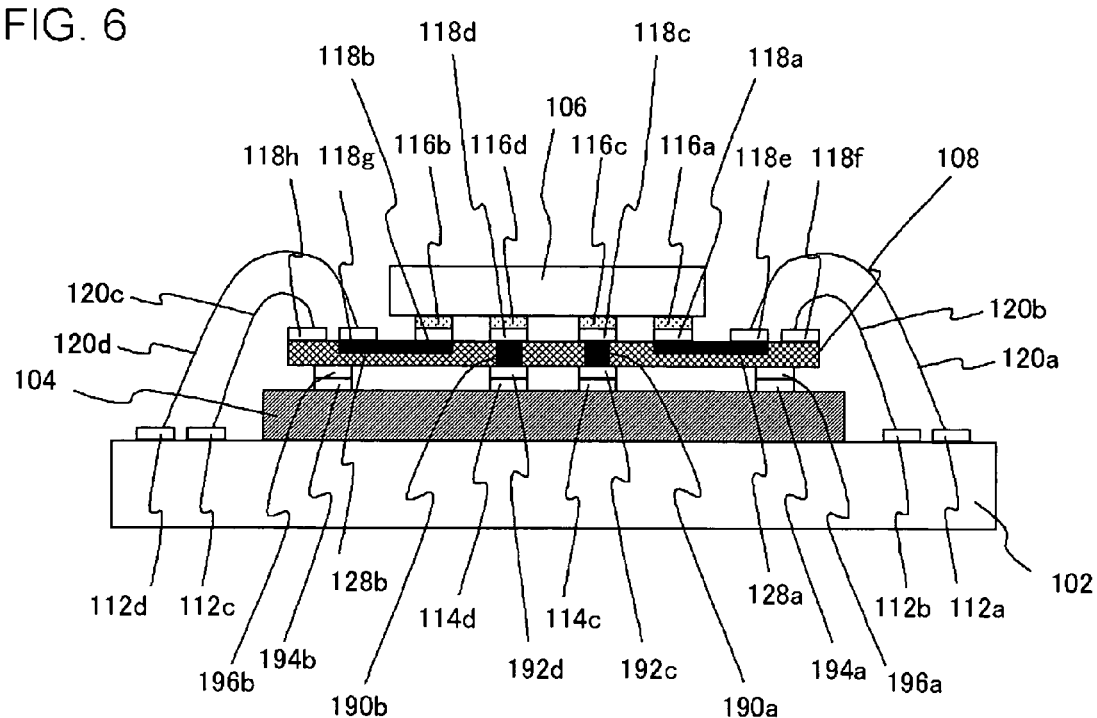
FIG. 6 is a schematic cross-sectional view showing a multichip stack structure according to a fourth embodiment.

FIG. 6 is a schematic cross-sectional view showing a multichip stack structure according to the fourth embodiment.

A semiconductor device 400 having a multichip structure according to the fourth embodiment has a similar configuration to the first embodiment, except for reinforcing components provided between the lower semiconductor chip 104 and the silicon spacer 108.

The reinforcing components provided between the lower semiconductor chip 104 and the silicon spacer 108 are respectively constituted of dummy bumps 194a and 194b formed on the upper surface of outer periphery of the lower semiconductor chip 104 and dummy bumps 196a and 196b formed on the lower surface of the projecting portion of the silicon spacer 108.

In this embodiment, the silicon spacer 108 may be either larger or smaller in dimensions in a plan view than the lower semiconductor chip 104. In other words, the silicon spacer 108 may be formed so as to reduce a space above the outer periphery of the lower semiconductor chip 104.

The dummy bumps 194*a*, 194*b*, 196*a*, and 196*b* may be either made of a conductive material similar to those used to form an ordinary electrode pad, or of a non-conductive material, since the dummy bumps 194*a*, 194*b*, 196*a*, and 196*b* do not have to serve as an electrode pad.

Providing the reinforcing component including the dummy bumps 194*a*, 194*b*, 196*a*, and 196*b* for sustaining the projecting portion of the silicon spacer 108 as described in the fourth embodiment provides a solid base for performing the wire bonding between the electrode pads 118*e*, 118*f*, 118*g*, and 118*h* on the silicon spacer 108 and the electrode pads 112*a*, 112*b*, 112*d*, and 112*c* on the upper surface of the substrate 102 respectively more stably.

Consequently, the configuration according to the fourth embodiment provides the semiconductor device 400 including the upper semiconductor chip 106 and the lower semiconductor chip 104 that are stacked, which offers a higher degree of freedom in selecting a size of the upper semiconductor chip 106 and the lower semiconductor chip 104, as well as in arranging the routing, and increase of the reliability and speed in signal transmission between the upper semiconductor chip 106 and the lower semiconductor chip 104.

Fifth Embodiment

Figure 7:
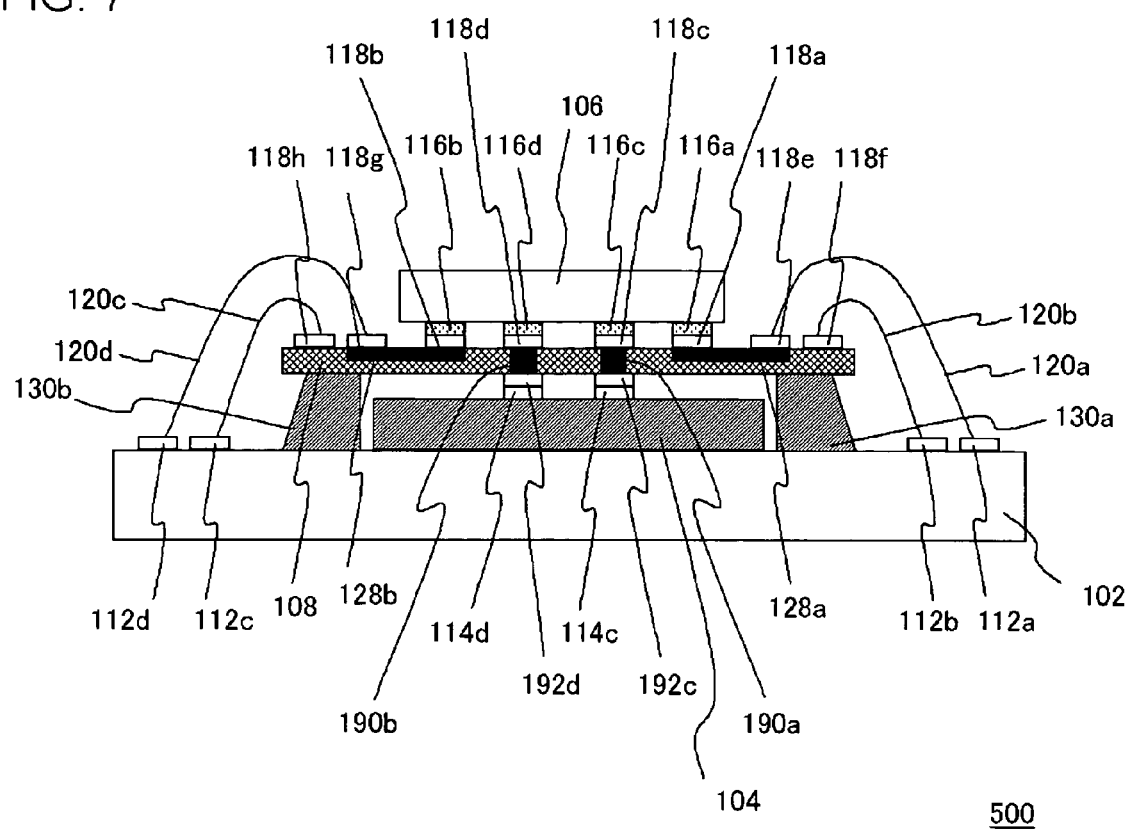
FIG. 7 is a schematic cross-sectional view showing a multichip stack structure according to a fifth embodiment.

FIG. 7 is a schematic cross-sectional view showing a multichip stack structure according to the fifth embodiment.

A semiconductor device 500 having a multichip stack structure according to the fifth embodiment has a similar configuration to the first embodiment, except for reinforcing components 130*a* and 130*b* for sustaining the silicon spacer 108 provided between the substrate 102 and the silicon spacer 108. Here, the reinforcing components 130*a* and 130*b* may be formed by injecting a resin with a dispenser or the like and curing the resin, for example.

In this embodiment, it is preferable that the silicon spacer 108 is larger in dimensions in a plan view than the lower semiconductor chip 104. In other words, it is preferable that the silicon spacer 108 includes a portion projecting farther outward than the outer periphery of the lower semiconductor chip 104.

Such configuration provides a solid base for performing the wire bonding more stably between the electrode pads 118*e*, 118*f*, 118*g*, and 118*h* on the silicon spacer 108 and the electrode pad 112*a*, 112*b*, 112*d*, and 112*c* on the upper surface of the substrate 102 via the wires 120*a*, 120*b*, 120*d*, and 120*c* respectively.

Consequently, the configuration according to the fourth embodiment provides the semiconductor device 500 including the upper semiconductor chip 106 and the lower semiconductor chip 104 that are stacked, which offers a higher degree of freedom in selecting a chip size of the upper semiconductor chip 106 and the lower semiconductor chip 104, as well as in arranging the routing, and increase of the reliability and speed in signal transmission between the upper semiconductor chip 106 and the lower semiconductor chip 104.

Features of the present invention have been described as above, regarding which it is to be understood that any optional combination of such features is also included in the scope of the present invention. Also, a conversion of an expression in the present invention into another category is also duly included in the scope of the present invention.

For example, while the foregoing embodiments provide a plate-shaped spacer constituted of a single-piece material, the spacer according to the present invention is not limited thereto. The spacer may be constituted of two plates layered spacer to each other, or of a plurality of plate-shaped spacers aligned at certain intervals.

With such configuration, it is equally possible to lead out the electrode pad disposed on the lower surface of the upper semiconductor chip 106 to a position farther outward than the outer periphery of the upper semiconductor chip 106, via the interconnect provided on the spacer.

Also, while the foregoing embodiments employ a silicon spacer as the plate-shaped spacer, the material of the spacer is not specifically determined. For example, another semiconductor or a resin compound may be employed to constitute the plate-shaped spacer.

Whichever material may be selected to constitute the spacer, the spacer may be prevented from being bent or inclined of the spacer when performing wire bonding on an outer end portion of an interconnect that is led, as long as the selected material has certain rigidity.

Meanwhile, a plate-shaped spacer, which is superior in rigidity to the insulating film employed in the COC structure shown in FIG. 12, naturally provides a more advantageous effect in the wire bonding, and thereby increases the stability of the manufacturing process of the multichip stack structure.

Further, the foregoing embodiment employs a wire bonding technique for connecting between the electrode pad on the upper surface of the plate-shaped spacer and the electrode pad on the upper surface of the substrate, but the connection according to the present invention is not limited thereto. Alternatively, an interconnect may be provided on the lower surface of the plate-shaped spacer, so as to be connected to an electrode pad on the upper surface of the plate-shaped spacer via a through electrode, and such interconnect may be directly connected to an electrode pad on the substrate.

With such configuration, it is equally possible to lead out the electrode pad formed on the lower surface of the upper semiconductor chip 106 to a position farther outward than the outer periphery of the upper semiconductor chip 106, via the interconnect provided on the spacer, and to connect to an electrode pad on the substrate.

It is apparent that the present invention is not limited to the above embodiment, that may be modified and changed without departing from the scope and spirit of the invention.

What is claimed is:

1. A semiconductor device, comprising:
   a first semiconductor chip;
   a second semiconductor chip provided on said first semiconductor chip; and
   a plate-shaped component formed between said first semiconductor chip and said second semiconductor chip, and said plate-shaped component including a projecting portion projecting farther outward than an outer periphery of said second semiconductor chip;
   wherein said first semiconductor chip includes a plurality of first electrode pads on a surface thereof facing said plate-shaped component,
   wherein said second semiconductor chip includes a plurality of second electrode pads and a third electrode pad on a surface thereof facing said plate-shaped component,
   wherein said plate-shaped component includes a plurality of through electrodes for connecting said first electrode pads and said second electrode pads, a fourth electrode pad formed on a surface of said projecting portion facing said second semiconductor chip, and an interconnect for directly connecting said third electrode pad and said fourth electrode pad, wherein said third electrode pad and said fourth electrode pad are connected to each other via only said interconnect, wherein said first electrode pads, said second electrode pads, and said through electrodes are substantially aligned along a single straight line, and wherein said interconnect is separated from each of said through electrodes.

2. The semiconductor device according to claim 1, wherein said through electrodes are connected to said first electrode pads and said second electrode pads respectively with a bump bonding.

3. The semiconductor device according to claim 1, wherein said plate-shaped component comprises a plate-shaped spacer.

4. The semiconductor device according to claim 1, wherein said plate-shaped component comprises a silicon spacer.

5. The semiconductor device according to claim 4, wherein said first semiconductor chip and said second semiconductor chip comprise a silicon semiconductor chip.

6. The semiconductor device according to claim 1, wherein said fourth electrode pad is formed farther outward than an outer periphery of said first semiconductor chip.

7. The semiconductor device according to claim 1, wherein said fourth electrode pad is connected with wire bonding.

8. The semiconductor device according to claim 1, further comprising a substrate, wherein said first semiconductor chip is provided on said substrate, and wherein said second semiconductor chip is provided on said first semiconductor chip.

9. The semiconductor device according to claim 8, further comprising a reinforcing component formed on said substrate, for sustaining said plate-shaped component at said projecting portion.

10. The semiconductor device according to claim 8, further comprising a reinforcing component formed on said first semiconductor chip for sustaining said plate-shaped component at said projecting portion.

11. The semiconductor device according to claim 8, wherein at least one fifth electrode pad is provided on an upper surface of said substrate.

12. The semiconductor device according to claim 11, wherein said at least one fifth electrode pad is wire bonded to said fourth electrode pad.

13. The semiconductor device according to claim 8, wherein said substrate is wire bonded to said plate-shaped component.

14. The semiconductor device according to claim 1, wherein said first semiconductor chip comprises a memory chip, and wherein said second semiconductor chip comprises a logic chip.

15. The semiconductor device according to claim 1, wherein said first semiconductor chip extends farther than said projecting portion.

16. The semiconductor device according to claim 1, wherein said interconnect has respective ends inside and outside of an outer periphery of said second semiconductor chip.

17. The semiconductor device according to claim 1, wherein said plate-shaped component has a thickness in a range of 50 μm to 100 μm.

18. The semiconductor device accordingly to claim 1, further comprising:

a substrate, wherein said substrate comprises at least one fifth electrode pad formed on a surface of said substrate at a position outside of an outer periphery of said first semiconductor chip, and wherein said at least one fifth electrode pad is electrically connected to said fourth electrode pad.

19. The semiconductor device according to claim 1, wherein said first semiconductor chip is larger than said second semiconductor chip in size, and wherein said interconnect connects said third electrode pad and said fourth electrode pad without penetrating through said first semiconductor chip.

20. A semiconductor device, comprising:

a first semiconductor chip;

a second semiconductor chip, said second semiconductor chip including at least one electrode pad formed thereon; and an interposer formed between said first semiconductor chip and said second semiconductor chip, said interposer comprising:

an extended portion extending beyond an outer periphery of said second semiconductor chip;

at least one electrode pad formed on said extended portion;

a plurality of through electrodes extending through said interposer; and at least one interconnect formed on said interposer, wherein said at least one electrode pad formed on said second semiconductor chip is rerouted to an area outside of the outer periphery of said second semiconductor chip by said interconnect and connected to said at least one electrode pad formed on said extended portion, and wherein said interconnect is separated from each of said through electrodes.

21. The semiconductor device according to claim 20, wherein said first semiconductor chip extends farther than said projecting portion.

22. The semiconductor device according to claim 20, wherein said interposer comprises a silicon spacer.

* * * * *